United States Patent [19]

Greenfield

[11] 4,290,023

[45] Sep. 15, 1981

[54] VOLTAGE OFFSET CIRCUIT FOR AUTO-ZERO LOW VOLTAGE AMPLIFIER

[75] Inventor: George Greenfield, W. Orange, N.J.

[73] Assignee: Sangamo Weston, Inc., Norcross, Ga.

[21] Appl. No.: 74,006

[22] Filed: Sep. 10, 1979

[51] Int. Cl.³ .................................................. H03F 1/02
[52] U.S. Cl. ......................................................... 330/9
[58] Field of Search ........................................... 330/9

[56] References Cited

U.S. PATENT DOCUMENTS

| | | | |
|---|---|---|---|
| 2,744,969 | 5/1956 | Peterson | 330/9 |
| 3,237,111 | 2/1966 | Skinner | 330/9 |
| 3,237,116 | 2/1966 | Skinner | 330/9 |
| 3,988,689 | 10/1976 | Ochi et al. | 330/9 |
| 4,010,424 | 3/1977 | Faulkner | 330/9 |

Primary Examiner—Harold A. Dixon
Attorney, Agent, or Firm—Joseph J. Kaliko; Mikio Ishimaru; Dale V. Gaudier

[57] ABSTRACT

A voltage offset circuit for use with an amplifier connected to receive low voltage signal inputs and operable for eliminating internal voltage offset errors of the amplifier as well as systemic voltage offsets. A variable voltage generating means is utilized to impress a voltage on an output capacitor of the amplifier which is operable in an auto-zero and measuring mode of operation. Preferably, the offset circuit and amplifier are utilized with digital meters employing an analog-to-digital converter having an auto-zero phase and measuring phase of operation.

8 Claims, 1 Drawing Figure

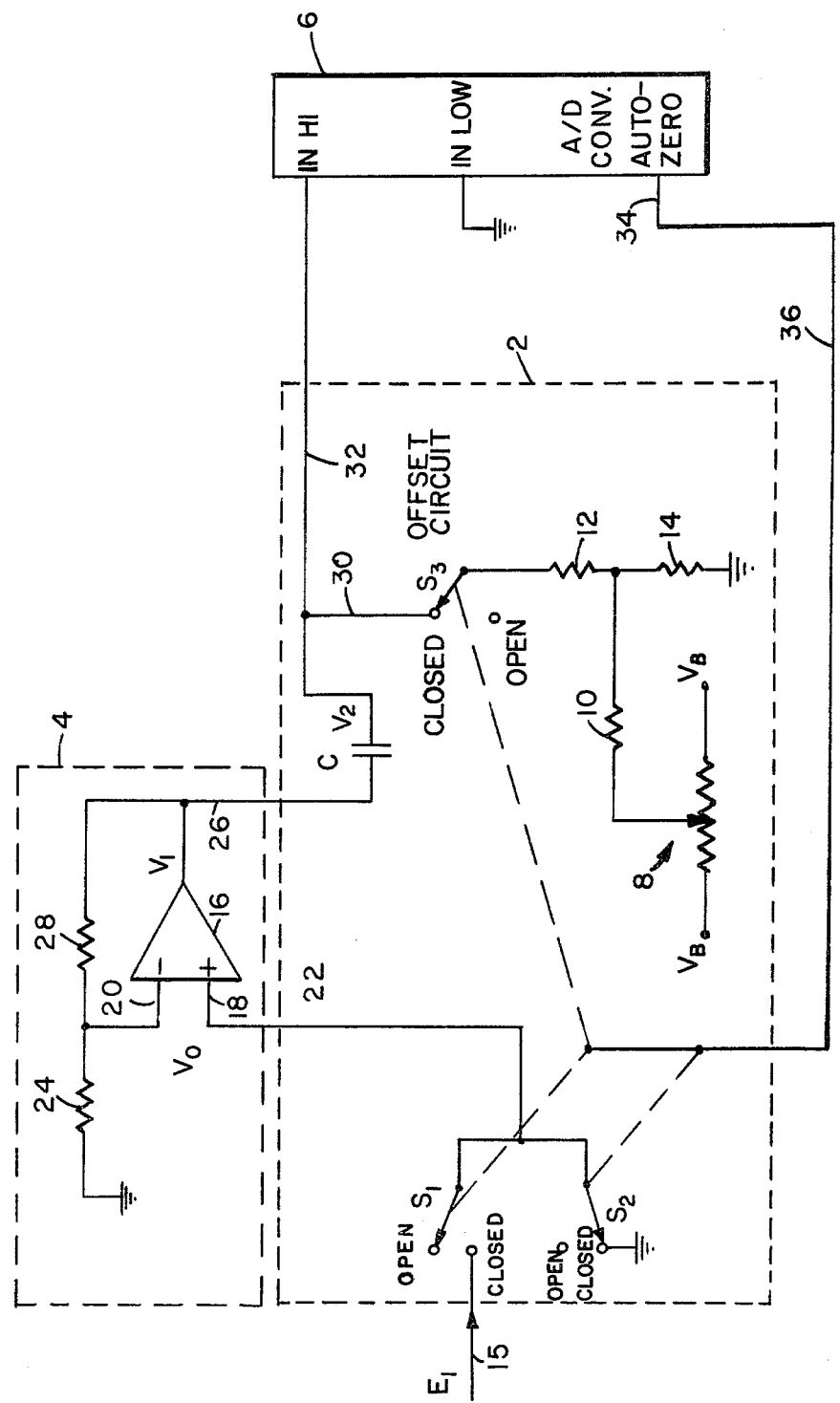

VOLTAGE OFFSET CIRCUIT FOR AUTO-ZERO LOW VOLTAGE AMPLIFIER

BACKGROUND OF THE INVENTION

1. Field of the Invention

The present invention relates to auto-zeroed analog-to-digital converters and amplifiers therefor, and relates particularly to a voltage offset circuit for a low noise auto-zeroed amplifier. Voltage offset circuits are particularly useful for annulling system offsets arising from sources being measured.

2. Description of the Prior Art

Almost all currently manufactured meters include means to set the indicator to a zero level. Such means are desirable to annul either offset error inherent in the meter itself or arising from the source being measured. In analog meters the zero adjustment typically comprises mechanical adjusting means, and in digital meters the zeroing feature takes the form of a circuit which injects a selectable or an adjustable voltage at some point in the circuit. For digital meters which utilize an analog-to-digital converter preceded by an amplifier, such voltage offset circuits are typically placed at the input of the amplifier feeding the analog-to-digital converter. In current analog-to-digital converter models an auto-zero function is employed for permitting an initial zeroing phase to precede each measurement phase of the conversion cycle. The auto-zero phase within the analog-to-digital converter is used primarily for annulling voltage errors on the integration amplifier, buffer amplifier and comparator within the analog-to-digital converter itself. An auto-zero signal is, however, also made available as an output signal for use in circuits external to the analog-to-digital converter. A typical auto-zero analog-to-digital converter, for example, is the dual slope converter comprising a pair of integrating circuits ICL 8068 and ICL 7103, manufactured by Intersil.

In utilizing offset circuits for the purpose of annulling offset errors arising from the source being measured, the offset correcting voltage is frequently required to be on the order of microvolts and is therefore difficult to generate accurately in the presence of such commonplace corrupting influences as unintentional thermocouple-type voltages, power supply noise and stray leakage effects.

SUMMARY OF THE INVENTION

It is an object of the invention to overcome the disadvantages of the prior art by providing a voltage offset circuit for use in correcting voltage offset errors arising in a low level DC amplifier and in sources applied to the input of the amplifier.

It is a specific object of the invention to inject a voltage offset at the output of an amplifier feeding an analog-to-digital converter so as to diminish the susceptibility to noise and other uncontrollable offset errors prevalent in the prior art.

The invention may be characterized as a voltage offset circuit for use with an amplifier having an input and an output. The input of the amplifier is connected to receive voltage input signals and the offset circuit comprises a sensing and storing circuit, a voltage generating means and means for adjusting the output of the voltage generating means. The sensing and storing circuit comprises means for correcting internal offset voltages generated by the amplifier and includes capacitor means connected on one side thereof to the amplifier output, switch means operable in a first position for connecting another side of the capacitor means to ground and for connecting the amplifier input to ground thereby forming an offset voltage sensing and storing circuit at the amplifier output, and operable in a second position to disconnect the sensing and storing circuit and connect the amplifier input to receive the input signals. The voltage generating means is connected between the other side of the capacitor means and ground and provides an additional offset voltage in the sensing and storing circuit. Finally, the adjusting means is utilized for adjusting the additional offset voltage.

BRIEF DESCRIPTION OF THE DRAWING

These and other objects of the invention will become apparent in reference to the sole drawing wherein the FIGURE illustrates a schematic diagram of the offset circuit utilized in accordance with the principles of the invention.

DETAILED DESCRIPTION OF PREFERRED EMBODIMENT

The FIGURE illustrates a voltage offset circuit 2 interconnected to an amplifier 4 and analog-to-digital converter 6 in accordance with the principles of the invention. The voltage offset circuit 2 comprises capacitor C, switches S1, S2 and S3, variable voltage generating means 8 and fixed resistors 10, 12 and 14. Switch S1 may be closed for connection of the input voltage signal $E_1$ along line 15 to the amplifier 4. Switch 2 may be closed for interconnecting a ground potential to the amplifier 4. Switch S3 is closed for interconnecting an output of amplifier 4 via capacitor C to ground potential via resistors 12 and 14.

Amplifier 4 comprises an amplifying means 16 having a non-inverting input terminal 18 and an inverting input terminal 20. Non-inverting input terminal 18 is connected to the voltage offset circuit 2 via a line 22. Inverting input terminal 20 is connected to ground potential via a resistor 24 and is connected to output line 26 of amplifying means 16 via a resistor 28. Output line 26 of amplifying means 16 is connected to one side of a capacitor C of offset circuit 2 which has its other side connected to S3 via a line 30 and to analog-to-digital converter 6 via a line 32. Line 32 is typically connected to a high input impedance terminal of the analog-to-digital converter 6 which has its low input line grounded. An auto-zero terminal 34 of the analog-to-digital converter 6 provides an auto-zero signal to the offset circuit 2 via a line 36. The auto-zero signal on line 36 is effective for opening and closing switches S1, S2 and S3 as indicated by the dotted lines. The switches S1, S2 and S3 are interconnected for operating in either of two positions, namely, S2 and S3 closed with S1 open or S2 and S3 open with S1 closed. In the first case the amplifier 4 is effectively connected in the sensing and storing circuit wherein the line 30 is grounded via resistors 12 and 14, and the non-inverting input terminal 18 of amplifying means 16 is also grounded via the line 22 and switch S2. The sensing and storing circuit is thus connected during an auto-zero phase of operation which precedes an actual measurement phase as is typical in analog-to-digital converters having an auto-zero mode.

When the switches are in the measurement phase of operation, switch S1 is closed, and switches S2 and S3 are open. In this phase, the input voltage signals from various sensors (not shown) are fed via lines 15 and 22 to the amplifying means 16 and subsequently to the analog-to digital converter 6.

In operation, the offset circuit 2 is first utilized in an auto-zero phase of operation to connect the sensing and storing circuit. In this mode of operation, the auto-zero signal on line 36 is effective to open switch S1 and close switches S2 and S3. For purposes of illustration, the voltage at the non-inverting input terminal 18 of amplifying means 16 may be termed $V_o$, the output of amplifying means 16 may be termed $V_1$, and the junction of lines 30 and 32 and capacitor C may be represented by a voltage $V_2$. During the auto-zero phase, the sensing and storing circuit is operable by means of a circuit path from ground potential through switch S2, line 22, amplifying means 16, line 26, capacitor C, line 30, switch S3, resistors 12 and 14 and again to ground potential. Ignoring for the moment the variable voltage generating means 8, the auto-zero measurement phase will ensure that $V_o$=zero and $V_1 = KV_{os}$, where $V_{os}$ is the internal voltage offset of the amplifying means 16. (Such internal offsets are common, for example, in current solid state operational amplifiers.) K is simply given by (R24+R28)/R24, where R24 and R28 are values of resistors 24 and 28 respectively. Variable voltage generating means 8 may be utilized to provide an additional offset voltage selected to cancel out offset values for measurements on systems which have systemic offsets as distinguished from the internal voltage offset of the amplifying means 16. Thus, variable voltage generating means 8 may be utilized to provide a voltage, for example, $+V_A$ at the juncture of resistors 12 and 14 so that capacitor C will be charged during the auto-zero phase (during connection of the sensing and storing circuit) to a voltage $V_1 - V_2 = KV_{os} - V_A$.

During the measurement phase of operation switch S1 is closed and switches S2 and S3 are open. In this condition, the input signal $E_1$ is fed via line 22 to the non-inverting input terminal 18 of amplifying means 16. $V_o$ consequently equals $E_1$. The voltage $KV_{os} - V_A$ remains on capacitor C since S3 is open and the input of the A/D converter 6 is a high impedance input. After amplification, the output voltage $V_1$ on line 26 is given by $KE_1 + KV_{os}$ because the internal offset $V_{os}$ acts as if it were a voltage source in series with E1. On the other side of capacitor C, the voltage $V_2$ is given by:

$$V_2 = KE_1 + KV_{os} - (KV_{os} - V_A)$$

$$V_2 = KE_1 + V_A.$$

It may thus be seen that the internal voltage offset, $V_{os}$, of the amplifying means 16 is completely cancelled out by means of the capacitor C and moreover, the additional offset voltage $V_A$ is retained so as to enable cancellation of systemic offsets as desired. The variable voltage generating means 8 may of course be utilized to establish either polarity offset voltage.

The injection of the voltage $V_A$ at the output of the amplifying means 16, as opposed to its input, reduces by the factor K any drift or noise which would otherwise be injected in the offset generating network and its associated adjustable voltage source. A further advantage of the particular offset circuit utilized is the fact that the auto-zero operation does not void or adversely effect the offset correcting voltage, $V_A$. Further, the capacitor C is grounded through a resistance network, namely resistors 12 and 14, and the resulting RC circuit forms a low pass filter which filters random noise which is a component of the internal offset voltage of the amplifier. Such noise extends primarily from the 0 to 10 hertz range and is attenuated by the low pass filter.

The invention is thus particularly useful in measuring low voltages which are produced by transducers such as strain gauge bridges, thermocouples or other low level sources. For such low voltage input sources the amplifier is particularly sensitive to injection of noise and thermal effects and, when used with an analog-to-digital converter and subsequent display, produces an undesirable jitter in the display output. The filtering effect coupled with the injection of the systemic offset voltage $V_A$ after the amplifying means 16 greatly improves system performance.

Although the invention has been described in terms of a selected preferred embodiment, the invention should not be deemed limited thereto since other embodiments and modifications will readily occur to one skilled in the art. It is therefore to be understood that the appended claims are intended to cover all such modifications as fall within the true spirit and scope of the invention.

What is claimed is:

1. A voltage offset circuit for use with an amplifier having an input and an output, said input connected to receive input signals, said offset circuit comprising:
    (a) sensing and storing circuit means for correcting internal offset voltages generated by said amplifier, said circuit means including:
        (i) capacitor means connected on one side thereof to said amplifier output, and
        (ii) switch means operable in a first position for connecting another side of said capacitor means to ground, and for connecting said amplifier input to ground thereby forming a sensing and storing path between said amplifier input and output, and operable in a second position to disconnect said path and connect said amplifier input to receive said input signals,
    (b) voltage generating means connected between said another side of said capacitor means and ground for providing an additional offset voltage in said sensing and storing path, and
    (c) means for adjusting said additional offset voltage.

2. An offset voltage circuit as recited in claim 1 wherein said switch means comprises a first switch means connected between said another side of said capacitor means and ground and a second switch means operable for connecting the input of said amplifier to receive either said input signal or ground potential.

3. An offset voltage circuit as recited in claim 2 wherein said voltage generating means is connected between said first switch means and ground.

4. An offset voltage circuit as recited in claim 3 further comprising resistor means connected between said first switch means and ground.

5. An offset voltage circuit as recited in claim 4 wherein said resistor means comprises a first and second resistor and said voltage generating means is connected between said first and second resistors.

6. An offset voltage circuit as recited in claim 5 wherein said voltage generating means has means for selecting the polarity of said additional offset voltage.

7. An offset voltage circuit for use with an amplifier having an input and output, said input connected to receive relatively low voltage input signals from sensors and said output connected to an analog-to-digital converter of the auto-zero type providing an auto-zero output signal, said offset circuit comprising:
(a) circuit means for correcting internal offset voltages of said amplifier, said circuit means including:
  (i) capacitor means connected on one side thereof to said amplifier output and on another side thereof to an input of said analog-to-digital converter,
  (ii) switch means operable in response to said auto-zero output signal for (1) connecting another side of said capacitor and said amplifier input to ground potential thereby forming a path between said amplifier input and output, and (2) connecting said amplifier input to receive said input signals, and
(b) voltage generating means connected between said another side of said capacitor means and ground potential for providing an additional offset voltage in said path.

8. An offset voltage circuit as recited in claim 7 further comprising means for adjusting said additional offset voltage.

* * * * *

UNITED STATES PATENT AND TRADEMARK OFFICE
CERTIFICATE OF CORRECTION

PATENT NO. : 4,290,023

DATED : September 15, 1981

INVENTOR(S) : George Greenfield

It is certified that error appears in the above-identified patent and that said Letters Patent are hereby corrected as shown below:

In the drawing figure, the reference to terminal "$V_B$" which is closest to resistor 14 is incorrect and should be

-- $-V_B$ --.

Signed and Sealed this

Nineteenth Day of January 1982

[SEAL]

Attest:

GERALD J. MOSSINGHOFF

Attesting Officer

Commissioner of Patents and Trademarks